(12) United States Patent
Wong et al.

(10) Patent No.: US 6,532,556 B1
(45) Date of Patent: Mar. 11, 2003

(54) DATA MANAGEMENT FOR MULTI-BIT-PER-CELL MEMORIES

(75) Inventors: Sau Ching Wong, Hillsborough, CA (US); Hock Chuen So, Redwood City, CA (US)

(73) Assignee: Multi Level Memory Technology, San Jose, CA (US)

( * ) Notice: Subject to any disclaimer, the term of this patent is extended or adjusted under 35 U.S.C. 154(b) by 0 days.

(21) Appl. No.: 09/492,949

(22) Filed: Jan. 27, 2000

(51) Int. Cl.[7] .................. G11C 29/00; G01R 31/28; G06F 12/04
(52) U.S. Cl. .................. 714/702; 714/718; 711/220
(58) Field of Search .................. 714/702, 718, 714/719; 711/220

(56) References Cited

U.S. PATENT DOCUMENTS

| | | |
|---|---|---|
| 4,586,163 A | 4/1986 | Koike |
| 4,796,260 A * | 1/1989 | Schilling et al. ............ 714/755 |
| 5,043,940 A | 8/1991 | Harari |
| 5,095,344 A | 3/1992 | Harari |
| 5,172,338 A | 12/1992 | Mehrotra et al. |
| 5,218,569 A | 6/1993 | Banks |
| 5,293,563 A | 3/1994 | Ohta |
| 5,365,486 A | 11/1994 | Schreck |
| 5,450,363 A | 9/1995 | Christopherson et al. |
| 5,475,693 A | 12/1995 | Christopherson et al. |
| 5,504,760 A | 4/1996 | Harari et al. |
| 5,515,317 A | 5/1996 | Wells et al. |
| 5,570,315 A | 10/1996 | Tanaka et al. |
| 5,583,812 A | 12/1996 | Harari |
| 5,587,948 A | 12/1996 | Nakai |
| 5,638,320 A | 6/1997 | Wong et al. |
| 5,659,550 A | 8/1997 | Mehrotra et al. |
| 5,680,341 A | 10/1997 | Wong et al. |
| 5,682,349 A | 10/1997 | Campardo et al. |
| 5,684,752 A | 11/1997 | Mills et al. |
| 5,689,465 A | 11/1997 | Sukegawa et al. |
| 5,691,938 A | 11/1997 | Yiu et al. |
| 5,694,356 A | 12/1997 | Wong et al. |
| 5,712,815 A | 1/1998 | Bill et al. |
| 5,745,409 A | 4/1998 | Wong et al. |
| 5,751,634 A | 5/1998 | Itoh |
| 5,761,222 A | 6/1998 | Baldi |
| 5,790,456 A | 8/1998 | Haddad |

(List continued on next page.)

Primary Examiner—Albert Decady
Assistant Examiner—C Britt
(74) Attorney, Agent, or Firm—David T. Millers

(57) ABSTRACT

A multi-bit-per-cell memory reduces the effect of defects and data errors by scrambling data bits before writing data. The scrambling prevents storage of consecutive bits in the same memory cell. When a memory cell is defective or produces an error, the bits read from the memory cell do not create consecutive bit errors that would be noticeable or uncorrectable. An error or a defect in a multi-bit memory cell causes at most scattered bit errors. Scramblers in multi-bit-per-cell memories can include 1) hardwired lines crossing between an input port and an output port, 2) programmable wiring options, 3) a linear buffer where reads from the buffer use addresses with swapped bits, or 4) a buffer array that switches between incrementing a row address first and incrementing a column address first when accessing memory cells in the buffer array.

22 Claims, 7 Drawing Sheets

U.S. PATENT DOCUMENTS

| | | |
|---|---|---|
| 5,802,553 A | 9/1998 | Robinson et al. |
| 5,815,425 A | 9/1998 | Wong et al. |
| 5,815,436 A | 9/1998 | Tanaka et al. |
| 5,822,256 A | 10/1998 | Bauer et al. |
| 5,847,992 A | 12/1998 | Tanaka et al. |
| 5,859,858 A | 1/1999 | Leeman |
| 5,862,080 A | 1/1999 | Harari et al. |
| 5,877,986 A | 3/1999 | Harari et al. |
| 5,896,340 A | 4/1999 | Wong et al. |
| 5,909,387 A | 6/1999 | Wong et al. |
| 5,909,390 A | 6/1999 | Harari |
| 5,909,449 A | 6/1999 | So et al. |
| 5,943,283 A * | 8/1999 | Wong et al. ............... 365/221 |
| 5,943,693 A | 8/1999 | Barth |
| 5,963,465 A | 10/1999 | Eitan |
| 5,969,985 A | 10/1999 | Tanaka et al. |
| 5,969,986 A | 10/1999 | Wong et al. |
| 5,982,663 A | 11/1999 | Park |
| 5,986,929 A | 11/1999 | Sugiura et al. |
| 5,999,445 A | 12/1999 | Rolandi et al. |
| 6,002,614 A | 12/1999 | Banks |
| 6,026,015 A | 2/2000 | Hirakawa |
| 6,038,166 A * | 3/2000 | Wong ................... 365/185.03 |
| 6,055,181 A | 4/2000 | Tanaka et al. |
| 6,058,060 A | 5/2000 | Wong |
| 6,067,248 A | 5/2000 | Yoo |
| 6,091,631 A | 7/2000 | Kucera et al. |
| 6,094,368 A | 7/2000 | Wong |
| 6,097,637 A | 8/2000 | Bauer et al. |
| 6,122,193 A | 9/2000 | Shibata et al. |
| 6,124,813 A * | 9/2000 | Robertson et al. .......... 341/143 |
| 6,134,143 A | 10/2000 | Norman |
| 6,134,145 A | 10/2000 | Wong |
| 6,137,719 A | 10/2000 | Tusuruda et al. |
| 6,149,316 A | 11/2000 | Harari et al. |
| 6,151,246 A | 11/2000 | So et al. |
| 6,208,542 B1 | 3/2001 | Wang |
| 6,215,148 B1 | 4/2001 | Eitan |
| 6,219,282 B1 | 4/2001 | Tanaka |
| 6,222,762 B1 | 4/2001 | Guterman |
| 6,229,734 B1 | 5/2001 | Watanabe |
| 6,232,632 B1 | 5/2001 | Liu |
| 6,233,717 B1 | 5/2001 | Choi |
| 6,259,627 B1 | 7/2001 | Wong |
| 6,278,633 B1 | 8/2001 | Wong et al. |
| 6,134,141 A1 | 10/2001 | Wong |
| 6,307,776 B1 | 10/2001 | So et al. |
| 6,314,025 B1 | 11/2001 | Wong |
| 6,330,185 B1 | 12/2001 | Wong et al. |
| 6,363,008 B1 | 3/2002 | Wong |
| 6,396,744 B1 | 5/2002 | Wong |

\* cited by examiner

DATA MANAGEMENT FOR MULTI-BIT-PER-CELL MEMORIES

BACKGROUND

1. Field of the Invention

This invention relates to multi-bit-per-cell memories and to data arrangements in multi-bit-per-cell memories that minimize the effect of memory errors and defects.

2. Description of Related Art

Recent developments in multi-media applications such as digital music in MP3 and AC3 formats, digital imaging for digital cameras, digital video for DV and digital camcorders, and the popularity of the internet and wireless communications have resulted in an explosive demand for cost-effective mass data storage devices with ultra high-density. Multi-bit-per-cell memories can effectively fill these needs. Multi-bit-per-cell memories use storage and retrieval techniques that provide N bits of data per memory cell and thereby increase the amount of data stored in a memory array by a factor of N when compared to binary memories. Multi-bit-per-cell Flash memories, in particular, are especially suitable for portable and battery-powered multi-media applications because Flash memories are non-volatile and provide a high-density of memory cells in an integrated circuit.

A concern when using multi-bit-per-cell memories is the accuracy of the storage and retrieval techniques. In particular, when a threshold voltage of a floating gate transistor in a memory cell represents an N-bit data value, a small error in the determination or the setting of the threshold voltage can cause a data error. Alpha particles, if not addressed properly, can also more easily create soft errors in multi-bit-per-cell memories than in conventional binary memories. Fortunately, many multi-media applications are error-tolerant or have built-in error detection and correction schemes for critical data such as the header information in an MP3 music data stream. Thus, a small number of data errors or defective memory cells may not cause a noticeable change in output quality. However, a large number of errors or multiple consecutive error bits may result in significant degradation in quality if these errors exceed the limits of the error correction technology.

Another concern is memory defects. Redundant or spare memory cells or arrays improve manufacturing yields of high-density memory ICs, particularly multi-level memories. Repair operations during fabrication of the memory ICs activate redundant memory cells of arrays in response to a test detecting one or more defective memory cells. Accordingly, before the IC memory device leaves the factory, test and repair operations can replace defective memory cells that have gross or hard defects with working redundant memory cells. Other memory cells may pass the initial testing but later fail or degrade quickly during the lifetime of the IC memory. For example, non-volatile memory cells containing floating gate transistors could have threshold voltages that change due to charge gain, charge loss, or contamination. Memory cells can also become sensitive to operating parameters such as supply voltage, temperature, and the data pattern, or endurance-related effects. The possibility of these "latent" defective memory cells often limits the use of multi-bit-per-cell memories and the maximum number of bits stored per cell because multi-bit-per-cell memories are more susceptible to latent defects.

FIG. 1 conceptually illustrates operation of a multi-bit-per-cell memory when recording an input serial data stream and playing back the serial data stream as output data. The data streams define input and output bit sequences 110 and 150. The conventional multi-bit-per-cell storage scheme groups N adjacent bits from bit sequence 110 into an N-bit value. An N-to-1 translator 120 converts the N-bit value into one of the $2^N$ levels (e.g., a corresponding threshold voltage level) that can be written into a single memory cell 130-1 of a memory array 130. (In FIG. 1, N is four, and each translator 120 converters a 4-bit value into one of 16 levels for storage in a memory cell.) The next N data bits from the serial data bit stream are grouped and written into a physically adjacent memory cell 130-2, typically in the same row or column as the previously accessed memory cell.

During the read (or playback) operation, the level stored in each memory cell is read, and a 1-to-N translator converts the read level back into the N adjacent bits. Finally, assembly of all of the bits read from adjacent memory cells constructs the bit sequence 150.

A multi-level memory having two translators 120 and 140 for each memory cell has too much overhead to be practical. FIG. 2 illustrates a more typical multi-bit-per-cell memory 200 including a memory array 210 with one N-to-1 translator 220 and one 1-to-N translator 230 that are multiplexed or shared among all the memory cells. A multi-level write circuit 225 programs a memory cell in array 210 according to the level from N-to-1 translator 220, and a multi-level read circuit 235 reads a memory cell to provide a read level to 1-to-N translator 230. A shift register 250 and a multiplexing circuit 240 control partitioning of an input serial data stream of M-bits into N-bit data units for N-to-1 translator 220 and assembling of N-bit data units from 1-to-N translator 230 to form the output serial data stream.

In the conventional scheme, any single memory cell failure can potentially affect N adjacent bits of the serial data stream. In particular, a slight shift in the read or written threshold voltage of a memory cell can corrupt all N adjacent data bits stored in the memory cell. For example, conventional binary coding of threshold voltage levels has adjacent data values 011 . . . 11b and 100 . . . 00b correspond to adjacent threshold voltage levels. A shift from one threshold voltage level to the adjacent threshold voltage level can changes all N bits (e.g., from 011 . . . 11b to 100 . . . 00b). If these N adjacent data bits all come from the same audio sample or the same pixel in an image, the error may cause a significant and noticeable distortion in the output signal (audio or image) upon playback.

U.S. Pat. No. 5,909,449, entitled "Multi-Bit-Per-Cell Non-Volatile Memory with Error Detection and Correction," which is hereby incorporated by reference in its entirety, describes Gray coding of threshold voltages to prevent more than a single bit error when a memory cell threshold voltage shifts from one level to an adjacent level. The Gray coding method is subject to multiple consecutive bit errors if a single memory cell fails in a more significant way than a single level shift. Accordingly, further methods for minimizing the effects of data errors in multi-level memories are sought.

SUMMARY

In accordance with an aspect of the invention, a data management method minimizes the effect that defective memory cells have on the quality of the data stored in multi-bit-per-cell memories.

A data management method in accordance with one embodiment of the invention mixes or scrambles a bit sequence from an input serial data stream before storage. The mixing or scrambling separates consecutive bits from each other. Consecutive bits are stored in different multi-level memory cells that are preferably physically spaced apart from each other in a memory array. Accordingly, any single memory cell failure or adjacent memory cell failures (such as one or more cells along a column or along a row) caused by threshold voltage drift, localized defects, endurance-related failures or soft errors, does not cause a long string of consecutive bit errors. The mixing of data bits spreads the effect of any single memory cell failure among data coming from, for example, different audio samples (at different times or different frequencies) or different pixels (for image or video) and typically makes the defects much less noticeable or easier to correct.

One embodiment of the invention is a multi-bit-per-cell memory that includes a storage array, a scrambler, and a write circuit. Each memory cell in the storage array stores N bits of information. The scrambler receives data including a group of M data bits and generates a set of scrambled N-bit values from the group of M data bits. Each scrambled N-bit value has bits in an order that differs from the bit order in the group. The write circuit receives the set of scrambled N-bit values from the scrambler and writes each scrambled N-bit value in an associated memory cell. In one embodiment, the memory further includes: a read circuit and a descrambler, but the descrambler can be implemented using the elements of the scrambler. The descrambler receives a set of N-bit values read from associated memory cells of the storage array and mixes bits from the N-bit values to reconstruct a group of M data bits.

Exemplary implementations of the scrambler include: a data input port hardwired to scramble data bits that are output from an output port; a linear buffer that outputs data bits in an order that differs from the order in which data was stored; and a buffer array with an address control circuit operable in a first mode that increments a row address for each bit accessed in the buffer array and a second mode that increments a column address for each bit accessed in the buffer array. With the buffer array, the scrambler provides a scrambled N-bit value by: sequentially writing bits from the group into the buffer array while operating in one of the first and second modes; changing mode; and reading N bits from the buffer array. For reading and data output, the scrambler provides output data by: sequentially writing bits from the read circuit into the buffer array while operating in one of the first and second modes; changing mode; and reading the output data from the buffer array.

In accordance with another embodiment of the invention, a method for writing or arranging data in a multi-bit-per-cell memory, includes scrambling data bits from an input serial data stream to create a scrambled data stream; partitioning the scrambled data stream into a set of N-bit values; and writing each N-bit value in a corresponding memory cell. Consecutive bits from the input serial data stream are not consecutive in the scrambled data stream so that a data error or defect in a single memory cell does not cause a string of N consecutive data errors. Operating the memory further includes reading a set of N-bit values from a set of the memory cells, and mixing bits from different N-bit values to generate output data. Circuitry inside an integrated circuit memory device such as the multi-bit-per-cell memories described herein can perform the scrambling, partitioning, writing, reading, and mixing.

BRIEF DESCRIPTION OF THE DRAWINGS

Use of the same reference symbols in different figures indicates similar or identical items.

DETAILED DESCRIPTION

In accordance with an aspect of the invention, a multi-bit-per-cell memory includes a data management circuit that selects non-consecutive bits from a serial data stream for storage in a memory cell. In one embodiment of an N-bit-per-cell memory, N consecutive bits are stored in N different memory cells, and X bits of the bit sequence are between any pair of bits stored in the same memory cell. The integer X is typically greater than or equal to N-1 and can be selected according to the type of data being stored in the multi-bit memory. In particular, X can be selected according to the size of data units in a serial data stream to avoid multiple bit errors in the same data unit of the data stream.

Figure 1:
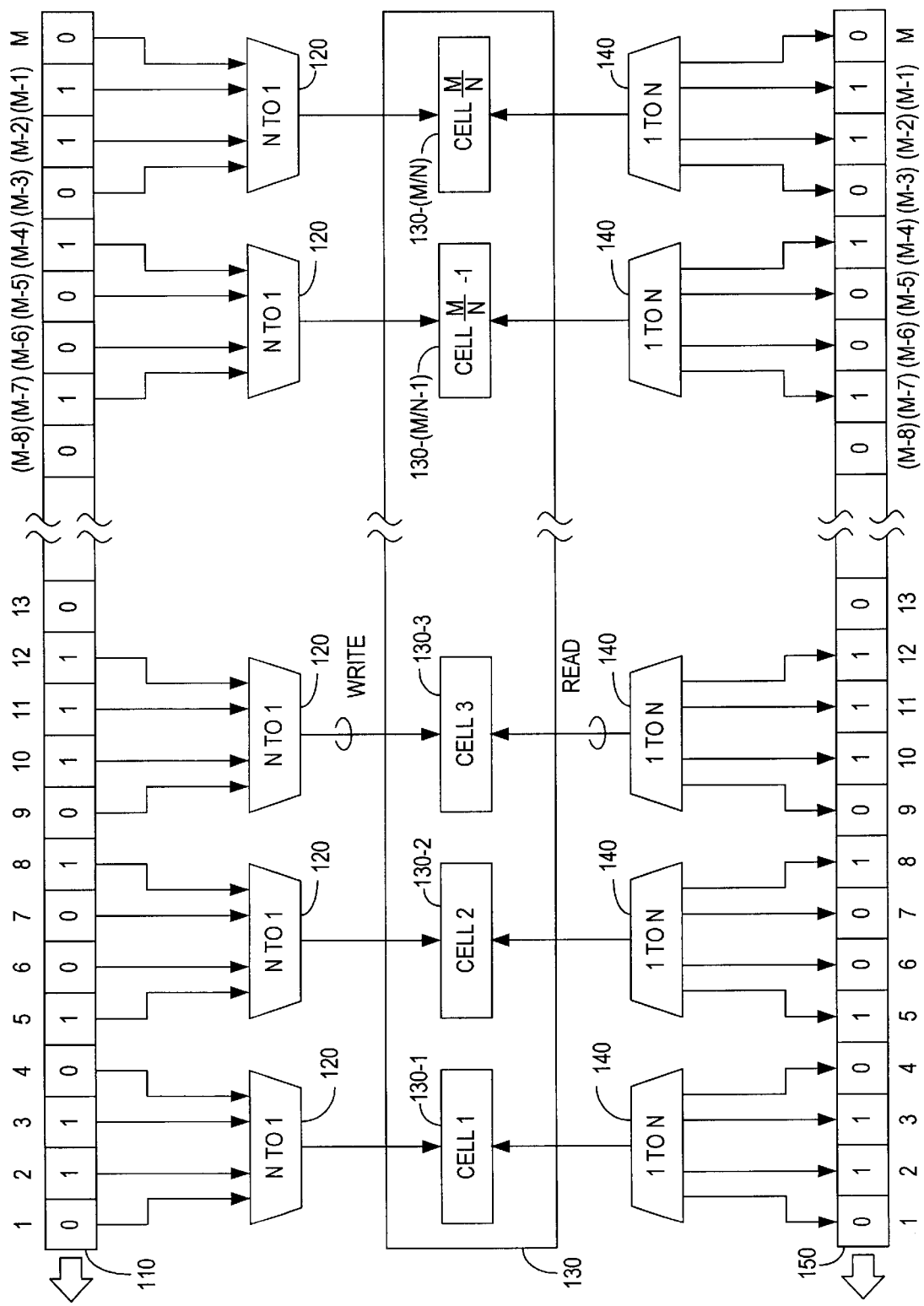
FIG. 1 illustrates conventional processes for recording or playing a serial data stream in a multi-bit-per-cell memory.
Figure 2:
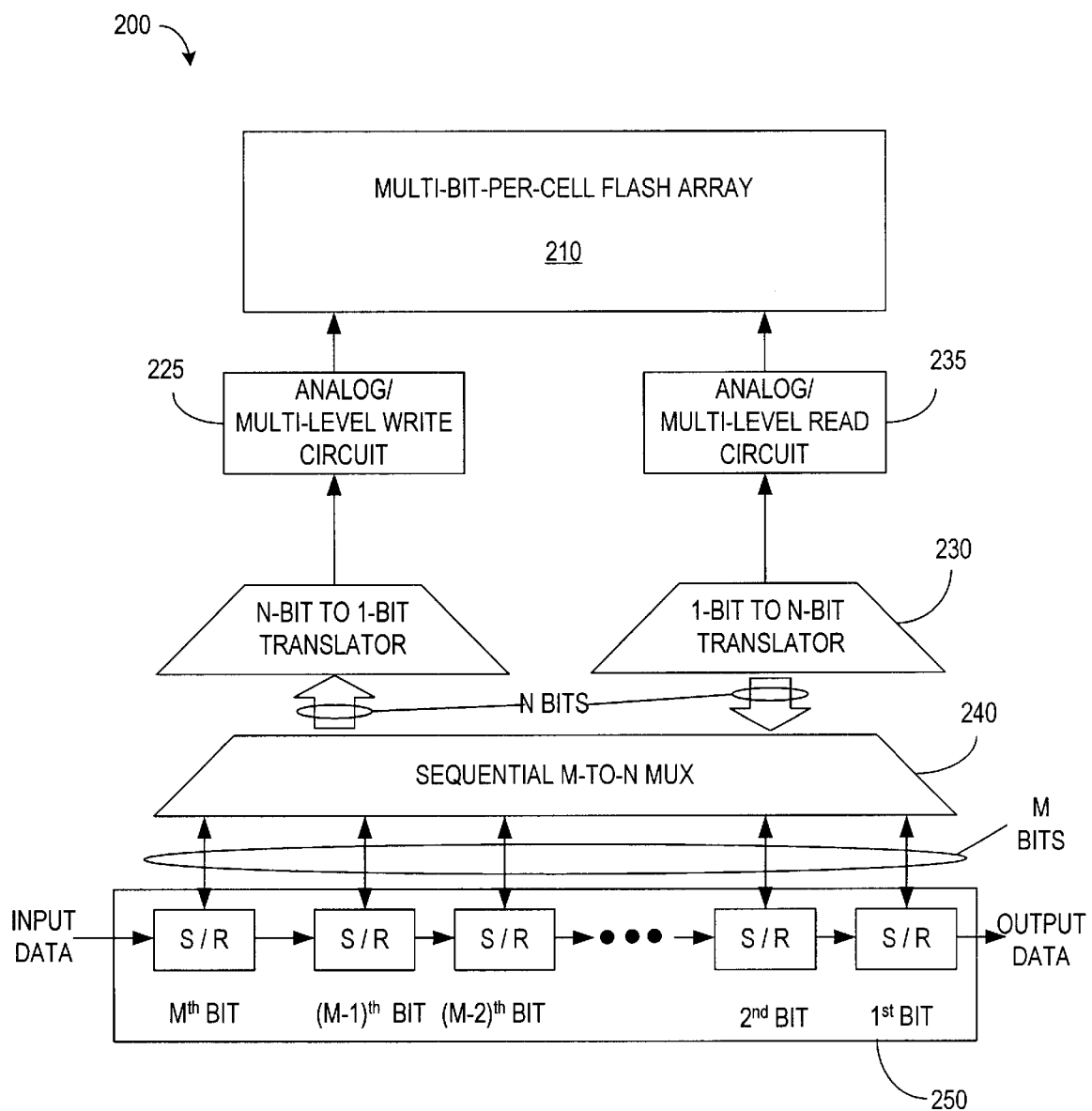
FIG. 2 is a block diagram of a conventional multi-level memory.
Figure 3:
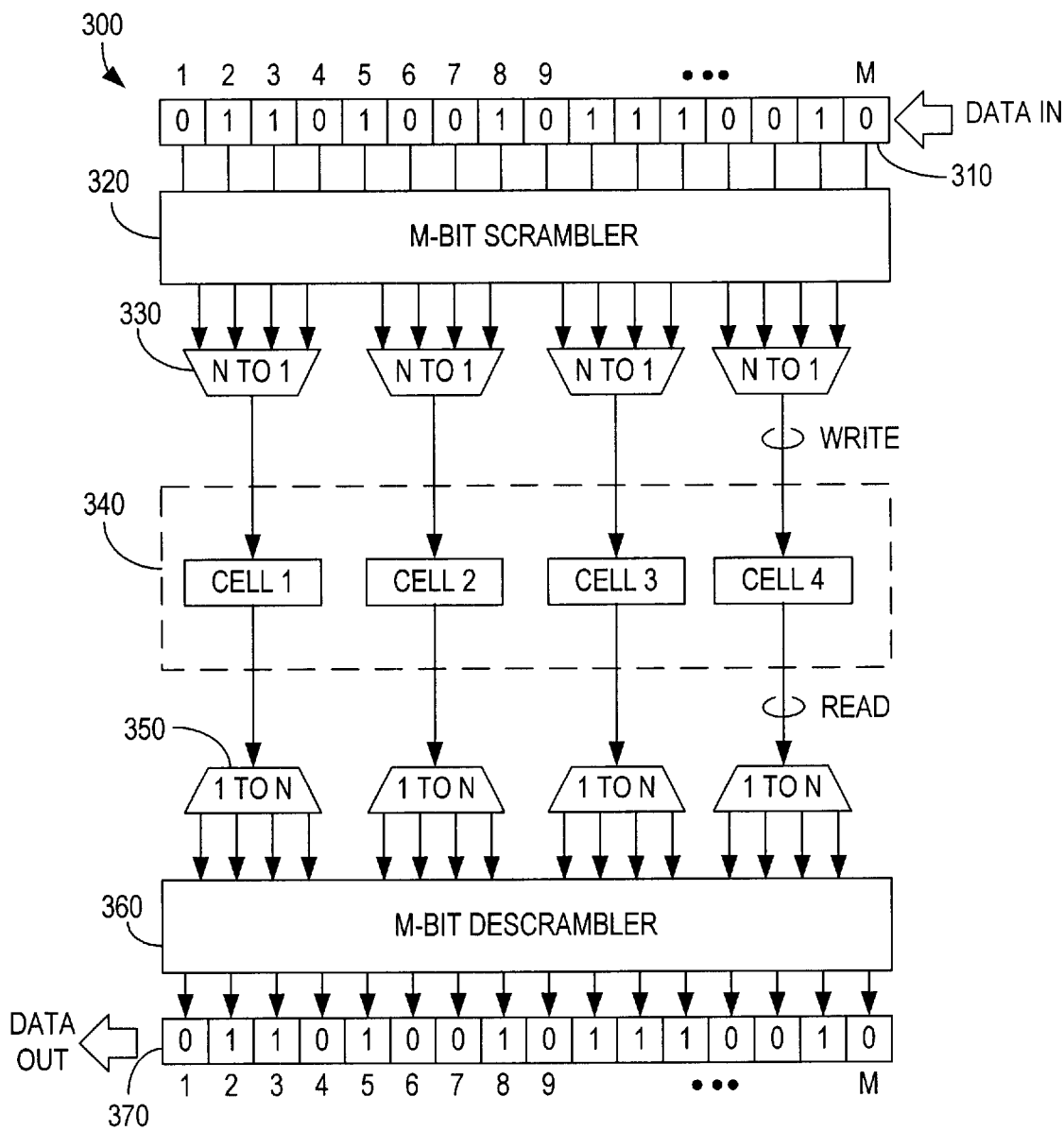
FIG. 3 illustrates a multi-bit-per-cell memory in accordance with an embodiment of the invention that scrambles a bit sequence for writing in memory cells and reconstructs the bits sequence when reading from the memory cells.

FIG. 3 illustrates a multi-bit-per-cell memory 300 in accordance with an embodiment of the invention. Memory 300 employs a data management process that partitions an input bit sequence from an input serial data stream into groups of M bits. M is an integer multiple of N, and N is the number of bits stored per cell in a storage array 340. A register 310 stores an M-bit group from the input serial data stream. An M-bit scrambler 320 mixes or scrambles the bits in each original M-bit group from register 310 to generate a scrambled M-bit group. The scrambled M-bit group includes (M/N) scrambled N-bit values that are input to a write circuit including translators 330. Translators 330 translate each scrambled N-bit value into one of the $2^N$ levels for writing into a corresponding one of the multi-level memory cells in array 340. Each translator 330 can perform any type of mapping from the N-bit values to the $2^N$ levels but preferably performs a linear translation or a Gray coding of the N-bit value.

For a multi-bit-per-cell Flash memory, the $2^N$ levels from translators 330 correspond to $2^N$ different target threshold voltage to which write circuitry can program a memory cell. A write operation for an M-bit group programs the threshold voltages of (M/N) memory cells to the levels associated with the respective N-bit scrambled values. The N-bit write operations can be performed in parallel, pipelined, or sequentially. For a sequential write operation, the write circuitry writes one scrambled N-bit value at a time, and only one translator 330 is required. Parallel or pipelined write operations can provide faster performance and higher bandwidth but require additional circuitry and consequentially additional circuit area and cost. Write and read circuits for multi-bit-per-cell memories are known in the art and described, for example, in U.S. Pat. No. 6,038,166, entitled "High Resolution Multi-Bit-Per-Cell Memory," which is hereby incorporated by reference in its entirety. U.S. Pat. No. 5,680,341, entitled "Pipelined Record and Playback for Analog Non-Volatile Memory"; U.S. Pat. No. 5,969,986, entitled "High-Bandwidth Read and Write Architecture for Non-Volatile Memories"; and U.S. Pat. No. 6,278,633, entitled "High Bandwidth Flash Memory that Selects Programming Parameters According to Measurements of Previous Programming Operations" describe suitable pipelined memory architectures and are also incorporated by reference in their entirety.

Upon playback of the M-bit group, the levels of the M/N cells from array 340 are read out, and translators 350 translate each level read back into an N-bit scrambled value. An M-bit descrambler 360 receives (M/N) scrambled N-bit values as read from memory cells 340-1 to 340-(M/N) and then re-mixes or unscrambles the scrambled M bit group to obtain the original M-bit data group. The M-bit descrambler 360 writes the original M-bit data group in a register 370 for output from memory 300 in the data units of the data stream.

There are many ways to mix the M bits of each group. For example, scrambler 320 can be hardwired on a chip or can be user-programmable to rearrange the M bits in a user-selected manner. Descrambler 370 performs the inverse of the mapping that scrambler 320 performs and can be hardwired or user-programmable.

In one embodiment, scrambler 320 implements an arbitrary mapping between an original M-bit group and a scrambled M-bit group. Hardwired connections between an input port for the original M-bit group and an output port for the scrambled M-bit group define the mapping. The connections between the input and output ports can also be programmable using routing circuitry making connections selected by a configuration register.

In another embodiment of the invention, scrambler 320 implements one-dimensional mixing according to an address defining the position of each bit in the original M-bit group. For example, if M is equal to $2^k$, the k address bits that decode the M bits in a binary sequence may be rearranged to scramble the binary sequence. For example, each bit in the original M-bit group has an address according to the bit's position in the original M-bit group, but the bit's position in the scrambled M-bit group has address bits swapped. Table 1 shows a mapping that interchanges address bits 0 and 2.

TABLE 1

| Original | Original Address | | | | Scrambled | New Address | | |
|---|---|---|---|---|---|---|---|---|
| | Bit 2 | Bit 1 | Bit 0 | | | Bit 2 | Bit 1 | Bit 0 |
| Data Bits 1 | 0 | 0 | 0 | | Data Bits 1 | 0 | 0 | 0 |
| Data Bits 2 | 0 | 0 | 1 | | Data Bits 5 | 0 | 0 | 1 |
| Data Bits 3 | 0 | 1 | 0 | ⇒ | Data Bits 3 | 0 | 1 | 0 |
| Data Bits 4 | 0 | 1 | 1 | | Data Bits 7 | 0 | 1 | 1 |
| Data Bits 5 | 1 | 0 | 0 | | Data Bits 2 | 1 | 0 | 0 |
| Data Bits 6 | 1 | 0 | 1 | | Data Bits 6 | 1 | 0 | 1 |
| Data Bits 7 | 1 | 1 | 0 | | Data Bits 4 | 1 | 1 | 0 |
| Data Bits 8 | 1 | 1 | 1 | | Data Bits 8 | 1 | 1 | 1 |

Alternatively, a two-dimensional address mixing scheme temporarily stores an M-bit group in a buffer array having binary memory cells in x rows and y columns, i.e., an x-by-y-bit buffer array. In this case, M is the product of x and y (M=x*y). In one scheme, when sequentially writing bits from the input bit sequence to the buffer array, the row address is cycled first (i.e., incremented for each bit written). After writing fills a column of the array, the column address is incremented and writing begins in the next column. Table 2 shows the resulting storage of data bits in the buffer memory array.

TABLE 2

| | Column 1 | Column 2 | ... | Column y |
|---|---|---|---|---|
| Row 1 | Data Bit 1 | Data Bit (x + 1) | ... | Data Bit (x(y − 1) + 1) |
| Row 2 | Data Bit 2 | Data Bit (x + 2) | ... | Data Bit (x(y − 1) + 2) |
| . | . | . | ... | . |
| . | . | . | ... | . |
| . | . | . | ... | . |
| Row x | Data Bit x | Data Bit (2x) | ... | Data Bit (x * y) |

When reading from the array, the column address is cycled first. After reading a row, the row address is incremented and reading begins in the next row. Writing and reading the bits in the described orders provides a scrambled M-bit sequence DB1, DB(x+1), DB(2x+1), ..., DBx, DB2x, ..., DB(x*y) from the original bit sequence DB1, DB2, ..., DBx, DB(x+1), DB(x+2), ..., DB(x*y). Bits that are adjacent in the original input sequence are separated by y−1 intervening bits in the scrambled input sequence.

Descrambler 360 can reverse or descramble the scrambling by cycling the column address first while writing the scrambled bit sequence into an x-by-y buffer array and cycling row address first during reading from the buffer array. Alternatively, scrambler 320 scrambles by cycling the column address first while writing the original bit sequence into the buffer array and cycling row address first during reading from the buffer memory array; and descrambler 360 descrambles by cycling the row address first while writing the scrambled bit sequence into the buffer array and cycling column address first during reading from the buffer array.

Use of the above described scrambling reduces the effect that data errors have on multimedia data. For example, a MP3 music data stream includes coded spectral data information for 32 subbands (frequencies). The 2-dimensional buffer memory array described above can temporarily store data from different subbands in different columns of the buffer array. When data are read out of the buffer memory array, data bits from one row, thus coming from different subbands, are grouped together before writing into the memory cells in the multi-level memory array. Accordingly, an error in one memory cell affects at most one bit in each of N subbands, instead of changing N bits in a single subband value. Generally, the single bit errors in several subbands have a less noticeable effect than does an N-bit error in a single subband.

Figure 4A:
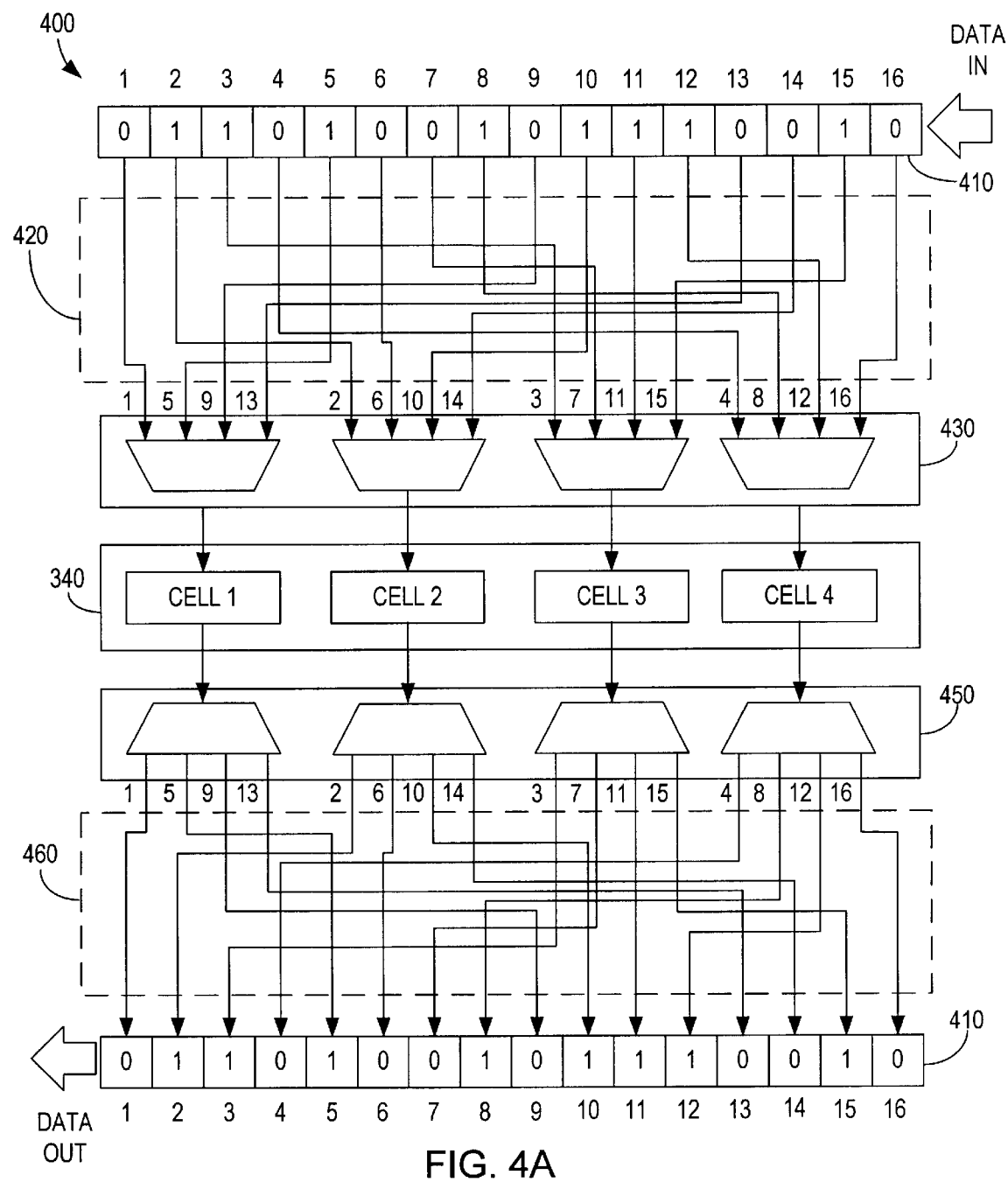
FIG. 4A illustrates a multi-bit-per-cell memory including a hardwired scrambler in accordance with an embodiment of the invention.

FIG. 4A illustrates a multi-level memory 400 with a hardwired scrambler 420 and a hardwired descrambler 460 in accordance with an embodiment of the invention. Multi-level memory 400 stores four bits of data per memory cell (N=4) and partitions input data into 16-bit groups (M=16) for scrambling. A shift register 410 receives a 16-bit data group for storage in a memory array 340. Scrambler 420 has an input port coupled to register 410 and an output port coupled to a write circuit 430. For a write operation, hardwired scrambler 430 mixes the 16 bits from shift register 410 and provides four 4-bit scrambled values to write circuit 430. Hardwiring in scrambler 420 can implement any mapping of the input port bits to the output port bits. In memory 400, the first scrambled 4-bit value includes bits 1, 5, 9, and 13 from shift register 410, the second scrambled 4-bit value includes bits 2, 6, 10, and 14 from shift register 410, the third scrambled 4-bit value includes bits 3, 7, 11, and 15 from shift register 410, and the fourth scrambled 4-bit value includes bits 4, 8, 12, and 16 from shift register 410. This happens to be equivalent to the one-dimensional scrambling described above where address bits 0 and 2 of the original 4-bit address are unchanged but address bits 1 and 3 are swapped.

Write circuit 430 writes the four scrambled values in four separate memory cells, for example, at four consecutive addresses in the memory array 340. Write circuit 430 can be any type of write circuit capable of writing a 4-bit value in a memory cell. In particular, write circuit 430 can be a conventional write circuit for a multi-bit-per-cell Flash memory that writes a 4-bit value in a memory cell by programming a threshold voltage of the memory cell to a target level associated with the 4-bit value. Such write circuits are well known in the art and can be implemented to write the four 4-bit values simultaneously (in parallel or pipelined) or sequentially. After writing the four 4-bit scrambled values, the next 16 bits in the serial data stream are loaded into shift register 410, and write circuit 430 writes the next set of four scrambled values in the next set of four memory cells of array 340.

A playback operation reads a series of memory cells and reconstructs a serial data stream from the values read. In memory 400, a read circuit 450 reads four memory cells and provides four 4-bit values to descrambler 460. In the exemplary embodiment of the invention, reading of a memory cell identifies a 4-bit digital value corresponding to the threshold voltage of the memory cell being read. A variety of read circuits capable of reading multiple bits from a memory cell are known in the art. Such read circuits can perform parallel, pipelined, or sequential operations to determine four read values. Descrambler 460 receives the four read digital values and directs individual bits for storage in specific bit locations in shift register 410. The descrambler 460 undoes the scrambling of scrambler 430. For example, the four bits from the first scrambled value are stored in bit locations 1, 5, 9, and 13 respectively in shift register 410. Shift register 410 then provides the output data in the correct order, which is the same order as in the input data stream. The record and playback operations of memory 400 can share a single shift register 410 since record and playback operations are typically not conducted simultaneously. Alternatively, memory 400 can include separate input and output shift registers to reduce the multiplexing circuits required between the shift register 410 and the read or write circuits.

Hardwired scrambler 420 and descrambler 460 are adaptable to wide variation in the connections between input and output ports. Further, scrambler 420 and descrambler 460 can include wiring options with a value in a configuration register selecting which wiring option conducts signals between the input and output ports. Such wiring options can be based on cross-point switches similar to configuration of a field programmable gate array.

Figure 4B:
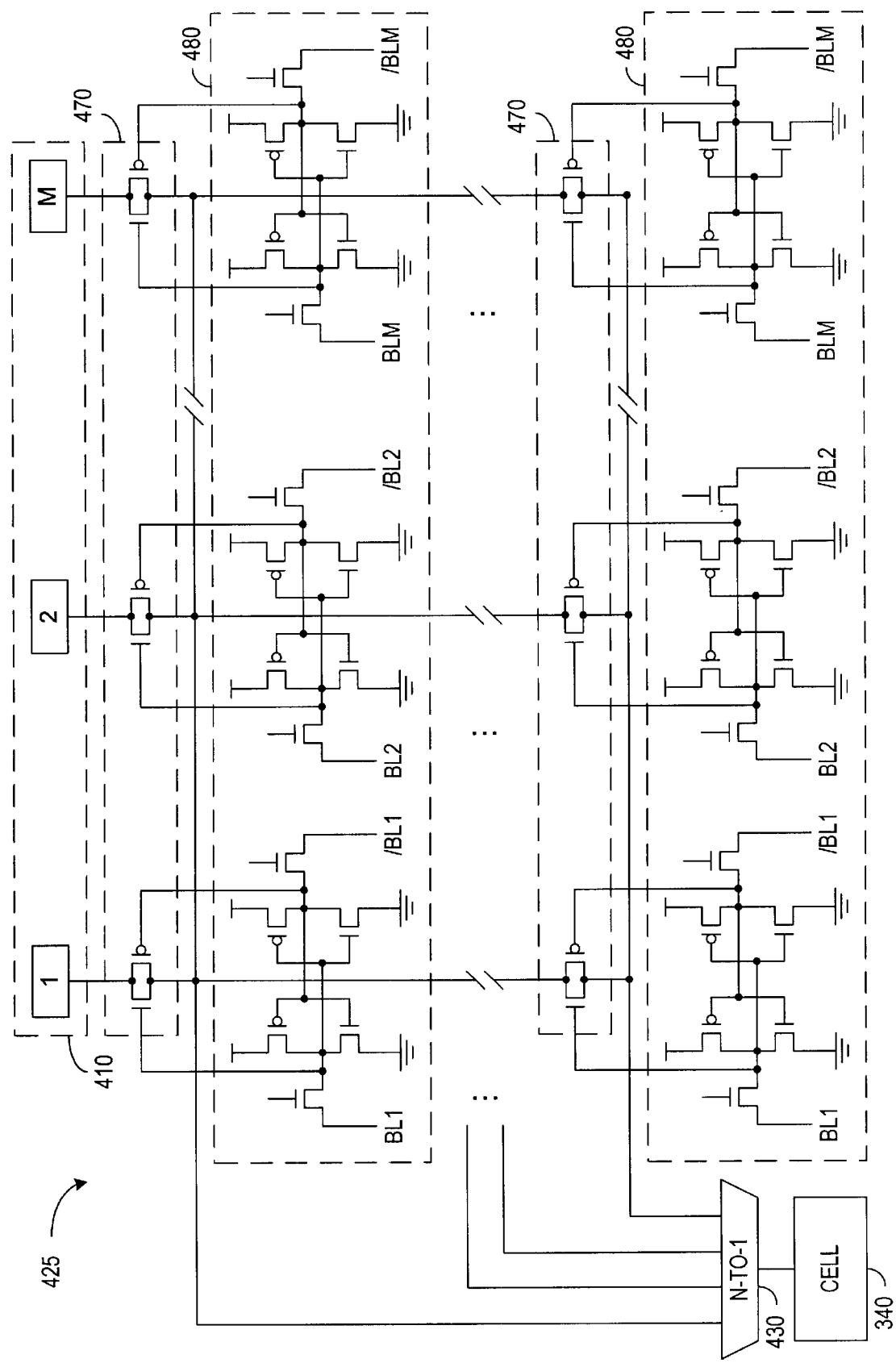
FIG. 4B shows a portion of a programmable scrambler that can replace the hardwired scrambler and descrambler of FIG. 4A.

FIG. 4B shows a programmable scrambler 425 that can replace the hardwired scrambler 420 of FIG. 4A. For each M output bits, scrambler 470 includes a set of transfer gates 470 and a configuration register 480. Configuration register 480 is an SRAM-based memory array that is configured during power up, by loading data from non-volatile memory (not shown) such as on-chip flash memory or an external Flash memory or EEPROM into configuration register 480. Each configuration register 480 turns on a single pass gate from the associated set 470 to select which bit from the input register 410 provides the output bit corresponding to that configuration register. The descrambler 460 can be similarly implemented with a full programmable scrambler such as scrambler 425, but the programming of the descrambler must be such that the descrambler undoes the bit mapping of the scrambler. Thus, the scrambling and corresponding descrambling can be user programmable to select scrambling for the type of data stream being stored. For example, scrambling can be tailored for the sizes of data units in the data stream.

Figure 5:
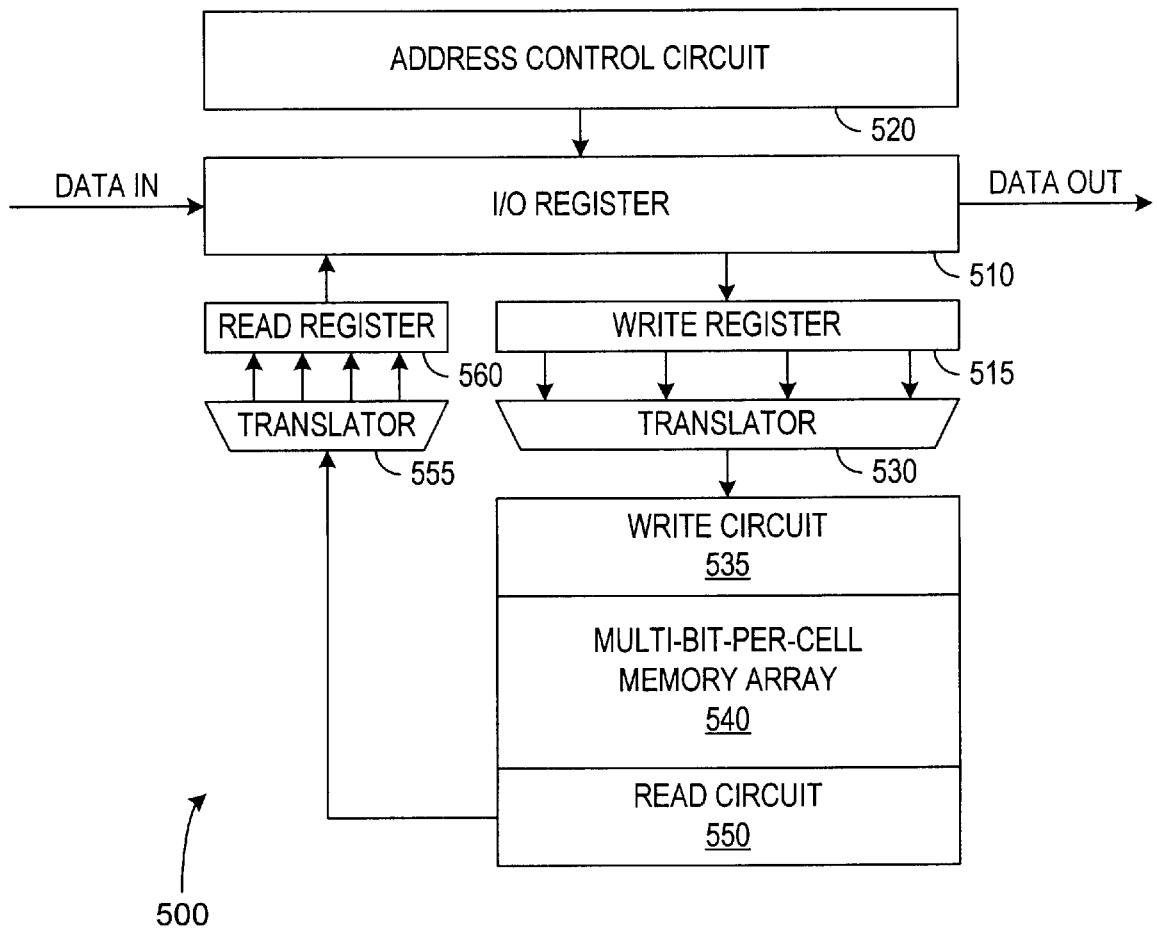
FIG. 5 illustrates a multi-bit-per-cell memory in which a scrambler includes a linear buffer in accordance with an embodiment of the invention.

FIG. 5 is a block diagram of a multi-bit-per-cell memory 500 implementing one-dimensional scrambling and descrambling for writing and reading a serial data stream. Memory 500 includes a linear buffer or input/output register 510 for data being written to or read from a multi-bit-per-cell storage array 540. An address control circuit 520 controls the order in which data bits are written to or read from I/O register 510. In particular, to record a serial data stream, input data bits are sequentially stored in I/O register 510 in a manner similar to a shift register so that M bits of data are in register 510 with the same order as in the serial data stream. Address control circuit 520 controls the order in which bits from I/O register 510 are passed to a write register 515. For example, instead of sequentially outputting bits from register 510 to register 515 according to a sequential counter, address control circuit 520 can swap address bits from a counter when designating which bit to output to register 515. When register 515 contains N bits scrambled according to the address signal from address control circuit 520, a translator 530 and a write circuit 535 write the scrambled N-bit value in a memory cell of storage array 540.

To read or play back the serial data stream, a read circuit 550 reads memory cells of storage array 540 in the order in which the memory cells were written. The read circuit 550. and a translator 555 provide the N-bit values read from storage array 540 to a read register 560. Read register 560 sequentially outputs bits to I/O register 510, and address control circuit 520 provides the addresses indicating where each bit is written. In particular, the address for writing from read register 560 reverses the address bit swapping used when writing from I/O register 510 to write register 515. The address bit swapping like the hardwired scrambling can be made user programmable through a configuration register (not shown).

Figure 6:
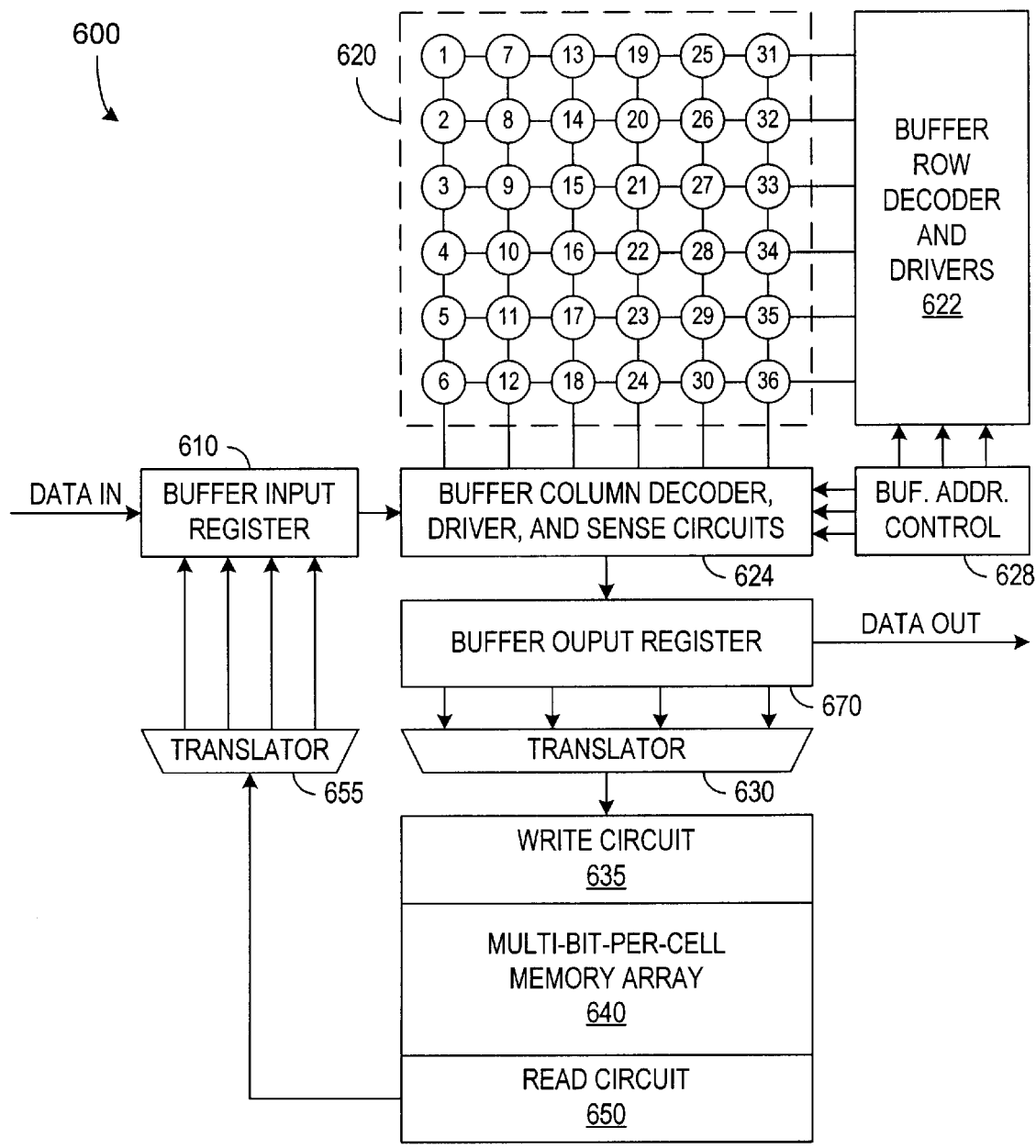
FIG. 6 illustrates a multi-bit-per-cell memory in which a scrambler includes a buffer array in accordance with an embodiment of the invention.

FIG. 6 is a block diagram of a multi-bit-per-cell memory 600 implementing two-dimensional scrambling and descrambling for writing and reading a serial data stream. Memory 600 includes a buffer memory array 620 and a multi-bit-per-cell storage array 640. Buffer array 620 is a conventional buffer including binary volatile memory cells (e.g., SRAM or DRAM cells) arranged in six rows and six columns. In FIG. 6, the memory cells in buffer 620 are numbered 1 through 36 indicating the order in which sequentially received data bits are written to buffer 620 when received from a buffer register 610 for recording in storage array 640. A buffer address control circuit 628 generates row and column address signals for a buffer row decoder and drivers 622 and a buffer column decoder, drivers, and sense circuits 624, respectively during access of buffer array 620.

For recording of a serial data stream, buffer input register 610 receives the data stream from outside memory 600 and passes individual bits to buffer column decoder drivers 624 for storage in buffer array 620. Buffer address control 628 increments the row address for each bit written in buffer array 620 and increments the column address after writing a data bit to the last memory cell in a column. This process writes 36 bits to memory cells 1 to 36 in order. After writing the 36 bits to array 620, buffer address control 628 generates address bits for reading bits from buffer array 620 and storing the bits in a buffer output register 670. For this read operation, buffer address control 628 increments the column address for each bit read from buffer array 620 and increments the row address after reading a data bit from the last memory cell in a row.

Buffer output register 670 receives and collects the bits read from buffer array 620 and provides 4-bit scrambled values to a translator 630 for storage in a memory cell in storage array 640. For example, the first 4-bit scrambled value includes bits 1, 7, 13, and 19, and the second 4-bit scrambled value includes bits 25, 31, 2, and 8. For 36 bits stored in buffer array 620, translator 630 receives nine scrambled 4-bit values for writing in storage array 640. A write circuit 635 sequentially, in parallel, or in pipelined manner writes each scrambled 4-bit value a corresponding memory cell. During this time, the buffer input register 610 holds any new input data until the new data can be written in buffer array 620 without interfering with the transfers from buffer array 620 to register 670. The process subsequently continues with writing 36 bits to buffer array 620, reading scrambled values from buffer array 620, and writing the scrambled values in storage array 640.

To retrieve or playback a serial data stream from storage array 640, a read circuit 650 reads storage cells of array 640 in the order in which the storage cells where written. For each storage cell read, a translator 655 converts a level read from the cell into a scrambled 4-bit value and stores that value in buffer input register 610. Buffer address control 628 generates address signal for writing the read bits in buffer array 620 starting at memory cell 1. For this write operation, buffer address control 628 increments the column address for each bit written to buffer array 620 and increments the row address after writing a bit to the last memory cell in a column. After writing 36 bits that result from reading nine storage cells, buffer address control 628 controls reading of data from buffer array 620 into buffer output register 670 for output from memory 600. For this operation, buffer address control 628 increments the row address for each bit read from buffer array 620 and increments the column address after reading a data bit from the last memory cell in a column.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A multi-bit-per-cell memory comprising:
   an array of memory cells wherein each memory cell stores N bits of information;
   a scrambler connected to receive a group of M data bits and provide a set of scrambled N-bit values containing bits from the group, wherein M is an integer greater than N, and bits in each scrambled N-bit value have an order that differs from an order in the group; and
   a write circuit coupled to the scrambler and the array, wherein the write circuit writes each scrambled N-bit value from the scrambler into a memory cell associated with the scrambled N-bit value.

2. The memory of claim 1, further comprising:
   a read circuit coupled to read the memory cells of the array; and
   a descrambler coupled to the read circuit, wherein the descrambler receives a set of N-bit values read from associated memory cells of the array and mixes bits from the N-bit values to reconstruct a group of M data bits.

3. The memory of claim 1, wherein the scrambler is hardwired to receive M bits in an order according to the group, mix the M bits to provide a scrambled M-bit group, and partition the scrambled M-bit group into the scrambled N-bit groups.

4. The memory of claim 3, wherein the scrambler comprises:
   an input port that receives the M bits in the order according to the group;
   an output port that provides the scrambled M-bit group; and
   connections between the input port and the output port that scramble the order of the bits of the M-bit group.

5. The memory of claim 1, wherein the scrambler is programmable to select a mapping according to which the scramble maps the M-bit group to a scrambled M-bit group that is partitioned into the scrambled N-bit groups.

6. The memory of claim 1, wherein:
   each bit in the group has a multi-bit address defining a position of the bit in the group; and
   the scrambler receives M bits of the group, creates a scrambled M-bit group by reordering each bit of the group according to a new address that results from swapping bits in the multi-bit address, and partitions the scrambled M-bit group into the scrambled N-bit groups.

7. The memory of claim 1, wherein the scrambler comprises:
   a buffer array; and
   an address control circuit for operation of the buffer array, the address control circuit being operable in a first mode that increments a row address for each bit accessed in the buffer array and a second mode that increments a column address for each bit accessed in the buffer array, wherein
   the scrambler provides a scrambled N-bit value by:
   sequentially writing bits from the group into the buffer array while operating in one of the first and second modes;
   changing mode; and then
   reading N bits from the buffer array.

8. The memory of claim 7, further comprising a read circuit coupled to read the memory cells of the array, wherein the scrambler provides output data by:
   sequentially writing bits from the read circuit into the buffer array while operating in one of the first and second modes;
   changing mode; and then
   reading the output data from the buffer array.

9. The multi-bit-per-cell memory of claim 1, wherein the scrambled N-bit values are such that no pair of consecutive bits in the group of M data bits are written into the same memory cell.

10. The multi-bit-per-cell memory of claim 1, wherein the group of M data bits contains X-bit data units, and the scrambled N-bit values are such that no two bits from the same X-bit data unit are in the same scrambled N-bit value.

11. The multi-bit-per-cell memory of claim 1, wherein the scrambled N-bit values are such that each set of N bits that are consecutive in the group of M data bits is spread over multiple memory cells when written in the array.

12. A method for writing data to a multi-bit-per-cell memory, comprising:
   scrambling data bits from a data stream to create a scrambled data stream, wherein the data stream contains X-bit data values with X being greater than 1;

partitioning the scrambled data stream into a set of N-bit values, wherein N is greater than 1; and writing each N-bit value in a corresponding memory cell, wherein the scrambling is such that for each X-bit data value in the data stream, no two bits from the X-bit data value are written in the same memory cell.

13. The method of claim 12, wherein circuitry inside an integrated circuit memory device performs the scrambling, partitioning, and writing.

14. The method of claim 12, further comprising:

reading a set of read N-bit values from a set of the memory cells; and mixing bits from different read N-bit values to generate output data.

15. The method of claim 14, wherein circuitry inside an integrated circuit memory device performs the scrambling, partitioning, writing, reading, and mixing.

16. The method of claim 12, wherein scrambling comprises receiving M bits at an input port that is hardwired to an output port, wherein hardwiring causes an order of bits along the output port to differ from an order of bits along the input port.

17. The method of claim 12, wherein:

each bit in an M-bit group from the data stream has a multi-bit address defining a position of the bit in the data stream; and scrambling comprises creating a scrambled M-bit group by ordering each bit according to a new address that results from swapping bits in the multi-bit address defining the position of the bit in the data stream.

18. The method of claim 12, wherein scrambling comprises:

sequentially writing bits from the data stream into a buffer while operating in the buffer in a first mode; and reading bits from the buffer array while operating in the buffer in a second mode, wherein one of the first and second modes increments a row address for each bit accessed in the buffer, and another of the first and second modes increments a column address for each bit accessed in the buffer.

19. A multi-bit-per-cell memory comprising:

an array of memory cells wherein each memory cell stores N bits of data, wherein N is greater than 1;

a scrambler connected to scramble bits of an input M-bit data group to generate a scrambled M-bit group, wherein the scrambled M-bit data group includes multiple scrambled N-bit values; and a write circuit coupled to the scrambler and the array, wherein the write circuit writes each scrambled N-bit value into a different one of the memory cells of the array.

20. The multi-bit-per-cell memory of claim 19, wherein the scrambled N-bit values are such that no pair of bits that are consecutive in the input M data group are written into the same memory cell.

21. The multi-bit-per-cell memory of claim 19, wherein the input M-bit data group contains X-bit data units, and the scrambled N-bit values are such that no two bits from the same X-bit data unit are in the same scrambled N-bit value.

22. The multi-bit-per-cell memory of claim 19, wherein the scrambled N-bit values are such that storage of each set of N bits that are consecutive in the input M-bit data group is spread over multiple memory cells in the array.

* * * * *